(12) United States Patent
Wrtiam et al.

(10) Patent No.: US 12,250,890 B2
(45) Date of Patent: Mar. 11, 2025

(54) TWO-TERMINAL ATOM-BASED SWITCHING DEVICE AND MANUFACTURING METHOD THEREOF

(71) Applicant: POSTECH Research and Business Development Foundation, Pohang-si (KR)

(72) Inventors: Banerjee Wrtiam, Pohang-si (KR); Hyun Sang Hwang, Daegu (KR); Seung Woo Lee, Siheung-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 388 days.

(21) Appl. No.: 17/833,691

(22) Filed: Jun. 6, 2022

(65) Prior Publication Data

US 2023/0061770 A1    Mar. 2, 2023

(30) Foreign Application Priority Data

Aug. 25, 2021    (KR) .................. 10-2021-0112305

(51) Int. Cl.
*H10N 70/20* (2023.01)
*H10N 70/00* (2023.01)

(52) U.S. Cl.
CPC .......... *H10N 70/24* (2023.02); *H10N 70/011* (2023.02); *H10N 70/841* (2023.02)

(58) Field of Classification Search
CPC ....................... H10N 70/24; G11C 2013/0083
See application file for complete search history.

(56) References Cited

U.S. PATENT DOCUMENTS

| 2012/0300532 | A1* | 11/2012 | Yamazaki | .......... | G11C 13/0069 |
| | | | | | 365/148 |
| 2016/0111637 | A1* | 4/2016 | Molas | .................. | H10N 70/826 |
| | | | | | 438/382 |
| 2019/0305218 | A1* | 10/2019 | Trinh | .................. | H10N 70/826 |

FOREIGN PATENT DOCUMENTS

KR    10-2014-0042987 B1    4/2014

* cited by examiner

*Primary Examiner* — Shih Tsun A Chou
(74) *Attorney, Agent, or Firm* — Morgan, Lewis & Bockius LLP (57) ABSTRACT

A two-terminal atom-based switching device having a fast operating speed and high durability and a manufacturing method thereof are disclosed. It is possible to reduce a forming voltage during positive voltage forming by forming an oxygen vacancy percolation path through negative voltage forming, which is first forming, and forming high binding energy and low formation energy between oxygen vacancies and metal ions implanted through positive voltage forming which is second forming after the negative voltage forming. Further, since a significant amount of metal ions implanted into the insulating layer through negative voltage application switching after the positive voltage forming is removed, the volatility of the two-terminal atom-based switching device may be improved, and a stuck-on failure phenomenon in the durability may be prevented.

4 Claims, 10 Drawing Sheets

FIG. 1

-Prior Art-

FIG. 2

-Prior Art-

TWO-TERMINAL ATOM-BASED SWITCHING DEVICE AND MANUFACTURING METHOD THEREOF

CLAIM FOR PRIORITY

This application claims priority to Korean Patent Application No. 10-2021-0112305 filed on Aug. 25, 2021 in the Korean Intellectual Property Office (KIPO), the entire contents of which are hereby incorporated by reference.

BACKGROUND

1. Technical Field

The present invention relates to a two-terminal atom-based switching device and a manufacturing method thereof, and more specifically, to a two-terminal atom-based switching device having a fast operating speed and high durability, and a manufacturing method thereof.

2. Related Art

Since a semiconductor memory device has a high number of memory cells per unit area and a fast operating speed, and can be driven at low power, many studies therefor have proceeded, and various types of memory devices have been developed.

Figure 1:
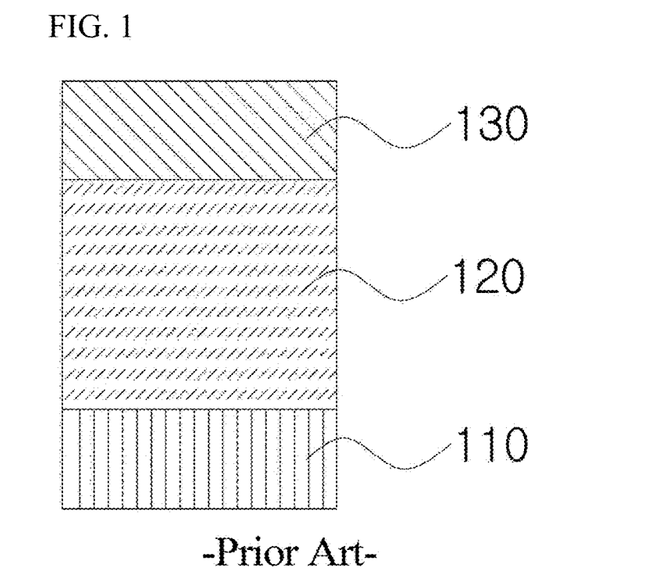
FIG. 1 is a view illustrating a general two-terminal switching device.

FIG. 1 is a view illustrating a general two-terminal switching device.

Figure 2:
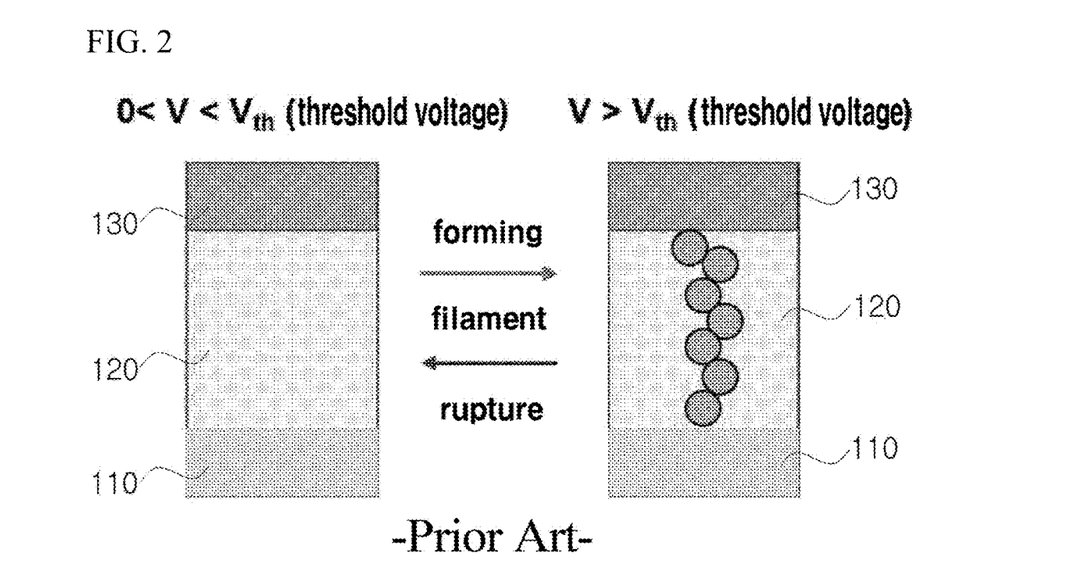
FIG. 2 is a view illustrating an operation process of the general two-terminal switching device.

FIG. 2 is a view illustrating an operation process of the general two-terminal switching device.

Figure 3:
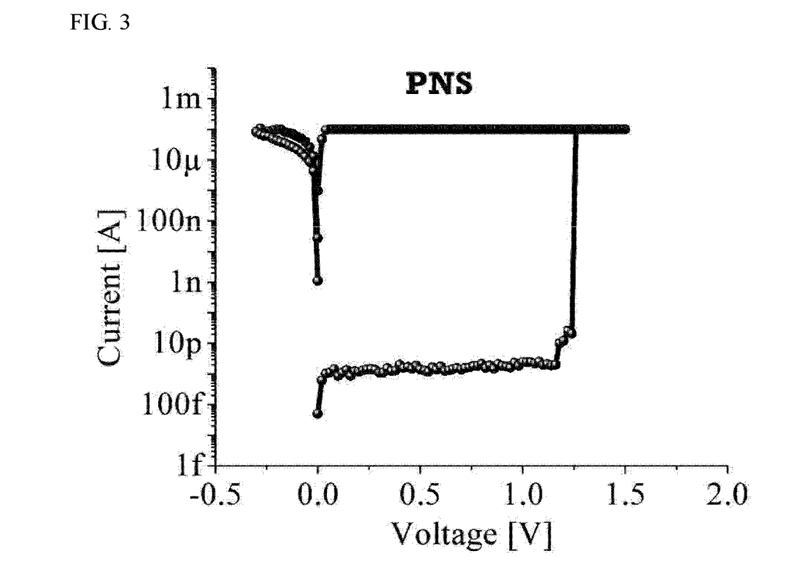
FIG. 3 is a graph illustrating a stuck-on failure phenomenon which occurs during positive voltage forming.

FIG. 3 is a graph illustrating a stuck-on failure phenomenon which occurs during positive voltage forming.

Referring to FIGS. 1 to 3, the two-terminal switching device includes a lower electrode 110, an insulating layer 120, and an upper electrode 130. When a voltage greater than a threshold voltage $V_{th}$ is applied to the two-terminal switching device, since the insulating layer 120 is turned on and thus a conductive filament is formed in the insulating layer 120, a low resistance state can be realized. That is, the insulating layer 120 may have a characteristic of a conductor. Further, when a voltage smaller than the threshold voltage Vin is applied to the two-terminal atom-based switching device, since a spontaneous rupture of the conductive filament is made while an ionization reaction proceeds in the insulating layer 120, the insulating layer 120 may have a characteristic of an insulator having a high resistance value. Accordingly, the insulating layer 120 is turned on or turned off according to a voltage applied between both electrodes 110 and 130.

In order to operate the two-terminal switching device like the above, a forming process of making a resistance of the insulating layer 120 changeable proceeds. However, when positive voltage forming in which forming proceeds by applying a positive (+) voltage to the upper electrode formed of a metal or alloy, as shown in FIG. 3, the stuck-on failure phenomenon occurs. That is, there is a problem in that a metal filament formed in the insulating layer 120 is not spontaneously ruptured by excessively implanted metal ions according to application of the positive voltage, and thus it has a non-volatile characteristic.

(Patent Document 1) Korean Laid-Open Patent 10-2014-0042987

SUMMARY

The present invention is directed to providing a two-terminal atom-based switching device having a fast operating speed and high durability by improving volatility using negative voltage forming and negative voltage application switching techniques, and a manufacturing method thereof.

In order to solve the above-described problem, a two-terminal atom-based switching device of the present invention includes: a lower electrode; an insulating layer formed on the lower electrode; and an upper electrode formed on the insulating layer, wherein, in the insulating layer, first forming is performed so that an oxygen vacancy percolation path is formed in the insulating layer, and then second forming is performed so that a filament due to metal ions is formed in the oxygen vacancy percolation path.

After the second forming, a negative voltage may be applied to the upper electrode so that some of the metal ions formed in the oxygen vacancy percolation path may be removed.

A negative voltage may be applied to the upper electrode for the first forming, and a positive voltage may be applied to the upper electrode for the second forming.

The upper electrode may be formed of Ag or AgTe, and the lower electrode may be formed of a different material from the upper electrode.

A compliance current, which is applied during the first forming and the second forming, may be applied as a current smaller than an operating current.

The compliance current may range from 1 nA to 10 nA.

A hold voltage generated during the first forming may have a voltage greater than 0.05 V.

In order to solve the above-described problem, a method of manufacturing a two-terminal atom-based switching device of the present invention includes: an operation of providing a two-terminal atom-based switching device including a lower electrode, an insulating layer formed on the lower electrode, and an upper electrode formed on the insulating layer; a first forming operation of forming an oxygen vacancy percolation path in the insulating layer; a second forming operation of forming a filament by metal ions in the oxygen vacancy percolation path; and a negative voltage application switching operation of removing some of the metal ions formed in the oxygen vacancy percolation path.

A negative voltage may be applied to the upper electrode in the first forming operation, and a positive voltage may be applied to the upper electrode in the second forming operation.

The upper electrode may be formed of Ag or AgTe, and the lower electrode may be formed of a different material from the upper electrode.

A compliance current, which is applied during the first forming operation, may be applied as a current smaller than an operating current.

The manufacturing method may further include alternately performing the second forming and the negative voltage application switching at least twice or more after the negative voltage application switching operation.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Since the present invention may apply various transformations and may have various embodiments, specific embodiments are exemplified in the drawings and described in detail in the detailed description. However, this does not limit the present invention to the specific embodiments, and it should be understood that the present invention includes all changes, equivalents, and substitutes included in the spirit and scope of the present invention. In the description of the present invention, when it is determined that a detailed description of a related known technology may obscure the gist of the present invention, the detailed description thereof will be omitted.

Hereinafter, embodiments according to the present invention will be described in detail with reference to the accompanying drawings, and in the description with reference to the accompanying drawings, the same reference numerals denote the same or corresponding components, and overlapping descriptions thereof will be omitted.

Figure 4:
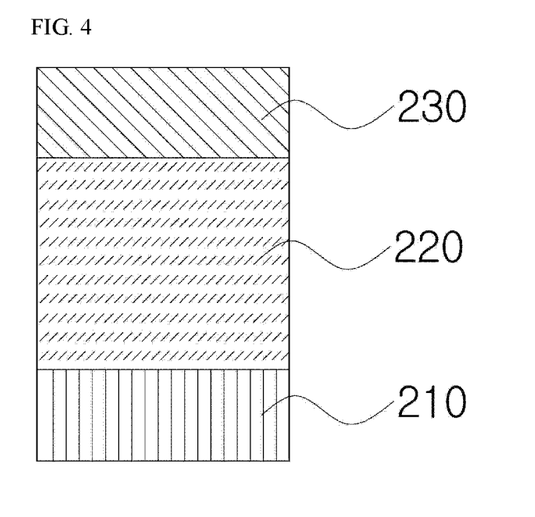
FIG. 4 is a view illustrating a two-terminal atom-based switching device of the present invention.

FIG. 4 is a view illustrating a two-terminal atom-based switching device of the present invention.

Referring to FIG. 4, the two-terminal atom-based switching device of the present invention includes a lower electrode 210, an insulating layer 220, and an upper electrode 230.

The lower electrode 210 may be formed of at least one material among Pt, Ir, W, Ag, Au, Ru, $RuO_2$, Ta, TaN, Ti, and TiN, but is not limited thereto, and may be formed of any electrode material having high inertness. For example, the lower electrode 210 may be formed on a substrate (not shown) to a thickness of 20 nm to 100 nm using a chemical vapor deposition method, a plasma vapor deposition growth method, or a sputtering method.

An insulating film (not shown) may be formed on the lower electrode 210, and holes which expose some regions of the lower electrode 210 may be formed in the insulating film (not shown). The insulating film (not shown) may be a silicon oxide film, a silicon nitride film, a silicon oxynitride film, or the like, but is not limited thereto.

An oxygen vacancy percolation path (oxygen vacancy cluster path) is formed during negative voltage forming, and the insulating layer 220 forming metal ions and an oxygen vacancy filament (hybrid filament-HF) due to positive voltage forming after the negative voltage forming may be formed on the lower electrode 210. For example, the insulating layer 220 may include an $HfO_2$ material.

The insulating layer 220 is a layer having a threshold switching characteristic, that is, the insulating layer 220 may have a characteristic of a conductor or a characteristic of an insulator with respect to a threshold voltage $V_{th}$. In this case, when a predetermined voltage is applied to the insulating layer 220, a sudden increase in current and a decrease in resistance occur, and a voltage which is applied in this case is referred to as the threshold voltage $V_{th}$.

The process of forming the insulating layer 220 may be performed using a physical vapor deposition method, a chemical vapor deposition method, or an atomic layer deposition method. For example, the insulating layer 220 may be formed to a thickness of 1 nm to 100 nm using the atomic layer deposition method.

The upper electrode 230 may be formed on the insulating layer 220. The upper electrode 230 may include at least one material among Pt, Ir, W, Ag, Au, Ru, $RuO_2$, Ta, TaN, Ti, and TiN, or a metal alloy such as AgTe. Preferably, the upper electrode 230 may include an Ag or AgTe material. For example, the upper electrode 230 may be formed using a chemical vapor deposition method, a plasma vapor deposition growth method, or a sputtering method.

Further, when the upper electrode 230 includes the Ag or AgTe material, the lower electrode 210 may be formed of a material other than the Ag or AgTe material, and when the lower electrode 210 includes the Ag or AgTe material, the upper electrode 230 may be formed of a material other than the Ag or AgTe material.

For example, when the upper electrode 230 includes the Ag or AgTe material and the lower electrode 210 includes a material other than the Ag or AgTe material, a negative voltage may be applied to the upper electrode 230 as a voltage applied for forming. Conversely, when the lower electrode 210 includes the Ag or AgTe material and the upper electrode 230 includes a material other than the Ag or AgTe material, a positive voltage may be applied to the upper electrode 230 as a voltage applied for forming.

That is, the polarity of the voltage for forming may be changed according to a position of the electrode including the Ag or AgTe material. This is due to a forming method of the present invention in which a subject of switching, that is, a filament, is the Ag or AgTe material, and an oxygen vacancy percolation path through the negative voltage forming is formed and then the filament is formed through the positive voltage forming after the negative voltage forming rather than forming an oxygen vacancy filament through the negative voltage forming like the related art.

Figure 5:
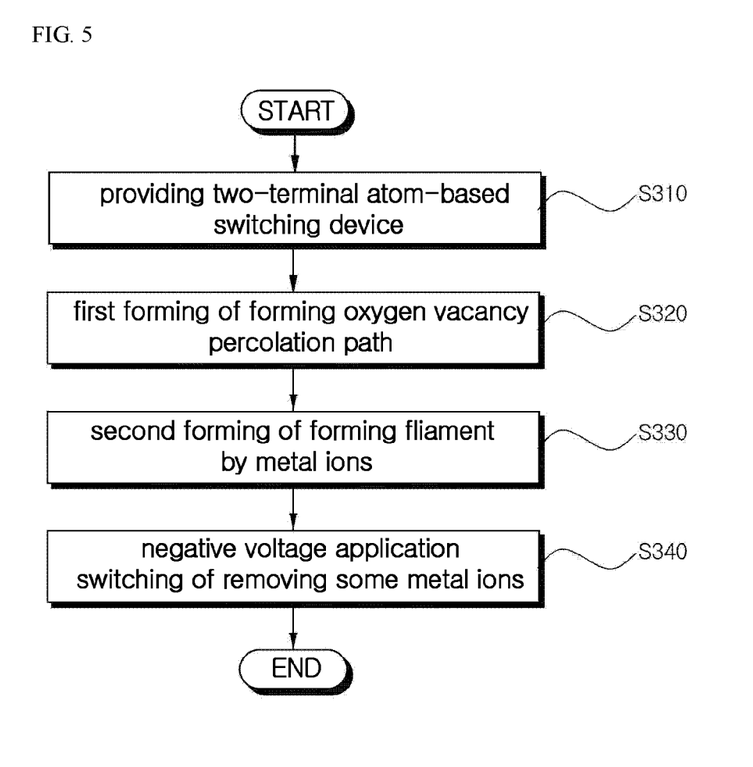
FIG. 5 is a flow chart for describing a manufacturing method of the two-terminal atom-based switching device of the present invention.

FIG. 5 is a flow chart for describing a manufacturing method of the two-terminal atom-based switching device of the present invention.

Referring to FIG. 5, the manufacturing method of the two-terminal atom-based switching device according to the present invention includes providing a two-terminal atom-based switching device including a lower electrode 210, an insulating layer 220 formed on the lower electrode 210, and an upper electrode 230 formed on the insulating layer 220 (S310), a first forming operation of forming an oxygen vacancy percolation path in the insulating layer 220 (S320), a second forming operation of forming a filament by metal ions in the oxygen vacancy percolation path (S330), and a negative voltage application switching operation of removing some of the metal ions formed in the oxygen vacancy percolation path (S340).

First, the two-terminal atom-based switching device is provided (S310). In the two-terminal atom-based switching device, the lower electrode 210, the insulating layer 220, and the upper electrode 230 may be sequentially formed, and a predetermined voltage may be applied to both ends of the lower electrode 210 or the upper electrode 230. Preferably, the upper electrode 230 may be formed of an Ag or AgTe material, and the insulating layer 220 may be formed of an $HfO_2$ material. Further, when a negative voltage is applied to the upper electrode 230 for the forming, the lower electrode 210 may be formed of a different material from the upper electrode 230, that is, a material other than the Ag or AgTe material.

After the two-terminal switching device is provided, an operation for forming and switching using the two-terminal switching device of the present invention may be performed.

Figure 6:
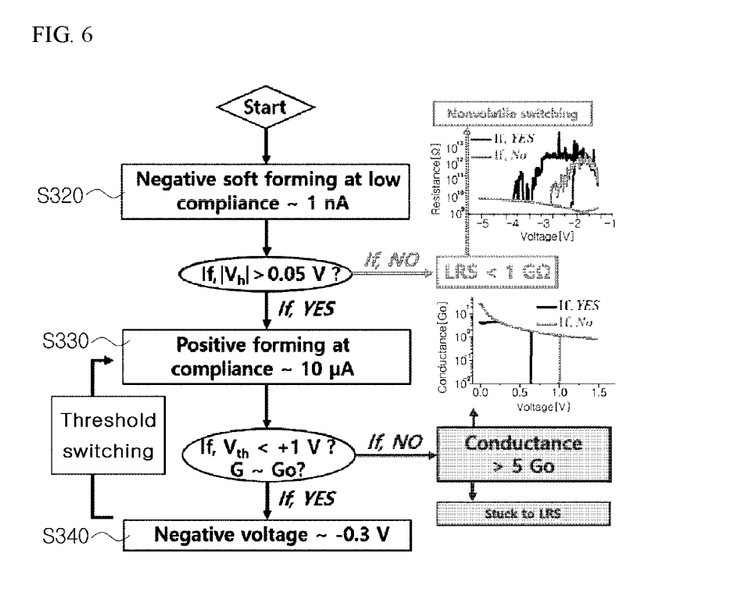
FIG. 6 is a view illustrating a flow chart according to forming and switching of the two-terminal atom-based switching device of the present invention.

FIG. 6 is a view illustrating a flow chart according to forming and switching of the two-terminal atom-based switching device of the present invention.

FIGS. 7A, 7B, 7C, and 7D are views illustrating an operation process according to forming and switching of the two-terminal atom-based switching device of the present invention.

An operation technique according to forming and switching of the two-terminal atom-based switching device of the present invention will be described with reference to FIGS. 6, 7A, 7B, 7C, and 7D.

Figure 7A:
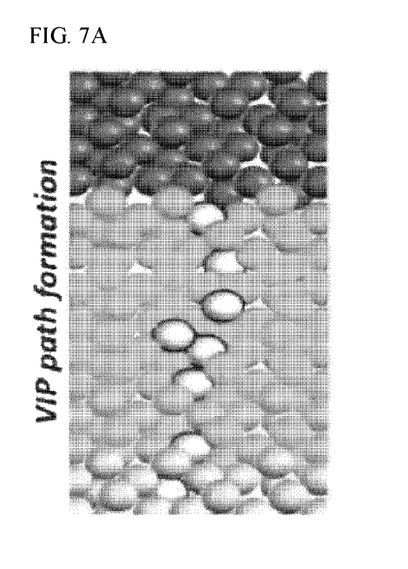
FIGS. 7A, 7B, 7C, and 7D are views illustrating an operation process according to forming and switching of the two-terminal atom-based switching device of the present invention.

In the first forming operation (S320), a negative (−) voltage may be applied to the upper electrode 230 for forming. For example, the negative voltage forming may be performed on the upper electrode 230 formed of the Ag or AgTe material. Since the negative voltage forming is performed on the upper electrode 230, as shown in FIG. 7A, the oxygen vacancy percolation path (oxygen vacancy cluster path) may be formed in the insulating layer 220. In this case, a compliance current smaller than an operating current may be applied to form the oxygen vacancy percolation path in the insulating layer 220. That is, the oxygen vacancy percolation path may be formed in the insulating layer 220 through a low forming compliance current instead of forming thick oxygen vacancy filaments by the forming like the related art. For example, the compliance current for first forming may have a range from 1 nA to 10 nA.

In this case, when the upper electrode 230 includes the Ag or AgTe material, a negative voltage should be applied to the upper electrode 230 for forming. Conversely, when the lower electrode 210 includes the Ag or AgTe material, a positive voltage should be applied to the upper electrode 230. That is, the polarity of the voltage applied to the upper electrode 230 may be changed according to the position of the electrode including the Ag or AgTe material.

Further, during the negative voltage forming, when a hold voltage $V_h$ is greater than 0.05 V, volatile switching is performed, and when the hold voltage $V_h$ is smaller than 0.05 V, nonvolatile switching is performed.

Figure 7B:
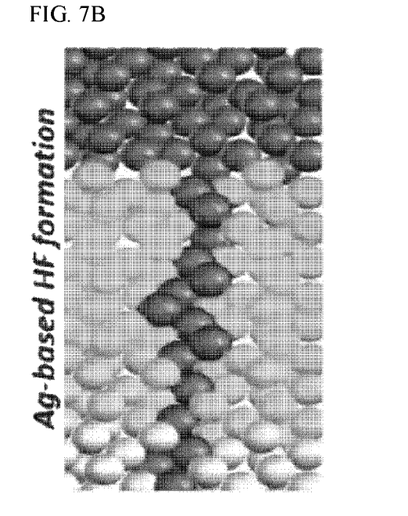

In the second forming operation (S330), a positive (+) voltage is applied to the upper electrode 230. That is, after the negative voltage is applied to the upper electrode 230 in the first forming operation (S320), the positive voltage forming may be performed again on the upper electrode 230 for second forming. Accordingly, as shown in FIG. 7B, the filament due to the metal ions may be formed in the oxygen vacancy percolation path formed in the insulating layer 220 by the first forming using the negative voltage.

For example, when the upper electrode 230 is formed of Ag, after the negative voltage is applied to the upper electrode 230, the second forming is performed using the positive voltage, and thus the filament (hybrid filament) due to Ag ions and oxygen vacancies may be formed in the oxygen vacancy percolation path. For example, the compliance current for second forming may have a range from 1 nA to 10 nA.

When the positive voltage is applied to the upper electrode 230 for the second forming, the threshold voltage $V_{th}$ is smaller than 1V, and when a conductance has a value similar to a unit conductance Go, a stuck-on failure phenomenon does not occur. However, when the threshold voltage $V_{th}$ is 1V or more and the conductance exceeds 5 Go, the stuck-on failure phenomenon occurs.

Figure 7C:
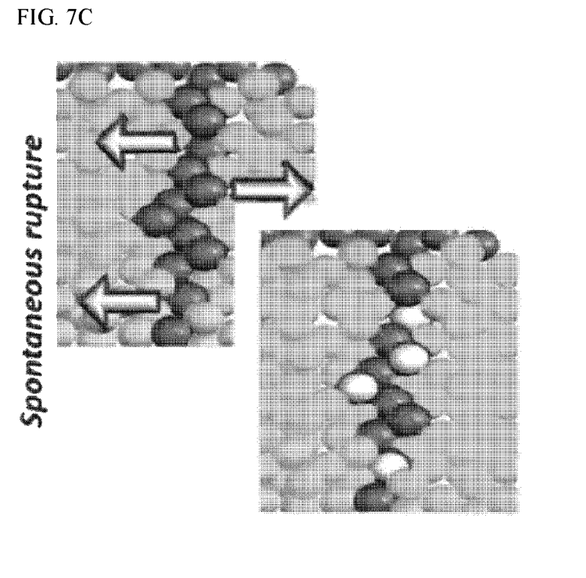

When the positive voltage applied for the second forming is removed, as shown in FIG. 7C, a spontaneous rupture of the formed filament is made.

As described above, in the method of manufacturing the two-terminal atom-based switching device of the present invention, the first forming of applying the negative voltage to the upper electrode 230 for forming (S320) is performed, and then the second forming of applying the positive voltage to the upper electrode 230 again (S330) is performed. That is, a filament due to metal ions and oxygen vacancies is formed in the oxygen vacancy percolation path through the second forming after forming the oxygen vacancy percolation path in the insulating layer 220 by the first forming.

Accordingly, the two-terminal atom-based switching device may have high binding energy and low formation energy between the metal ions implanted through the positive voltage forming and the oxygen vacancies. Due to the high binding energy and low formation energy between the metal ions and the oxygen vacancies, the forming voltage may be reduced during the positive voltage forming after the negative voltage forming. This may have an effect of improving the volatility and durability of the two-terminal atom-based switching device by preventing excessive metal ion implantation into the insulating layer 220.

After the first forming and the second forming are performed, the negative voltage application switching operation may be performed on the upper electrode 230 (S340). Here, a small negative voltage having a range from −0.1 V to −0.5 V may be applied as the negative voltage to be applied so that an oxygen vacancy filament or oxygen vacancy percolation path may not be formed.

Figure 7D:
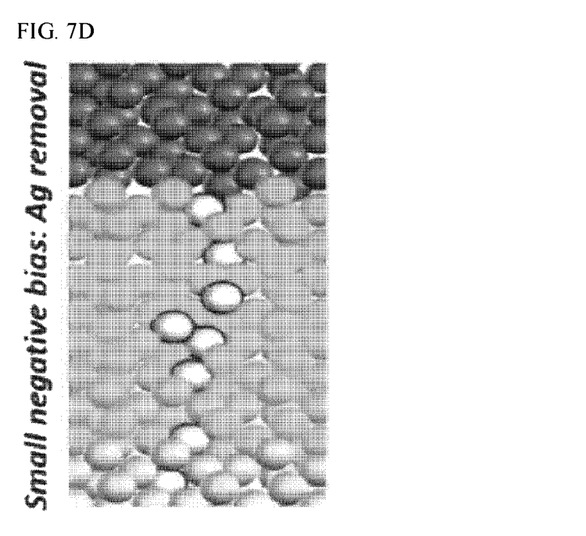

After the first forming and the second forming, most of the metal ions implanted into the insulating layer 220 may be removed by performing the negative voltage application switching which applies the negative voltage. That is, after the forming, as a small negative voltage is applied to the upper electrode 230, as shown in FIG. 7D, most of the metal ions excessively implanted into the insulating layer 220 may diffuse to the upper electrode 230 again.

In the negative voltage application switching, after the filament is formed, a separate reset process for removing the filament is not required, and the small negative voltage is applied to move the metal ions in the insulating layer 220 toward the upper electrode 230 after the spontaneous filament rupture according to removal of the positive voltage applied by the second forming, and thus the metal ions in the insulating layer 220 may be removed.

As most of the metal ions implanted into the insulating layer 220 are removed by the negative voltage application switching after the first forming and second forming, the volatility of the two-terminal atom-based switching device may be improved, and the stuck-on failure phenomenon in the durability may be prevented.

Further, the negative voltage application switching may be repeatedly performed every second forming process of repeatedly applying the positive voltage for a volatile switching operation.

As described above, in the two-terminal atom-based switching device of the present invention, since a negative voltage is applied in the first forming operation (S320) and then a positive voltage is applied in the second forming operation (S330), excessive implantation of the metal ions into the insulating layer 220 may be prevented, and most of the residual metal ions in the insulating layer 220 may be removed by the negative voltage application switching operation of applying a predetermined negative voltage each time after the second forming by the positive voltage (S340), and thus the volatility and the durability of the two-terminal atom-based switching device may be improved.

FIGS. 8A, 8B, 8C, and 8D are graphs illustrating electrical measurement results for an operation technique of the two-terminal atom-based switching device of the present invention.

Figure 8A:
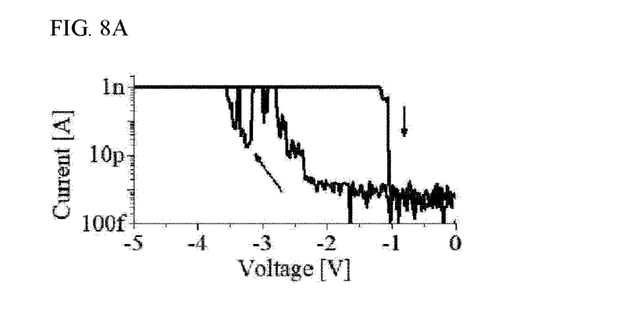
FIGS. 8A, 8B, 8C, and 8D are graphs illustrating electrical measurement results for an operation technique of the two-terminal atom-based switching device of the present invention.
Figure 8B:
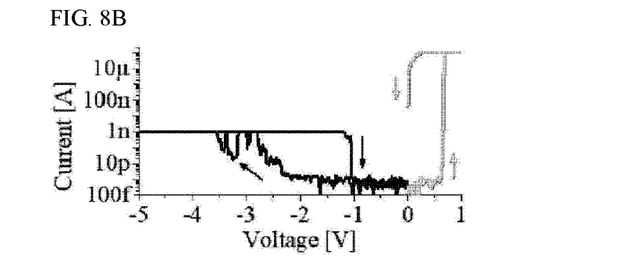
Figure 8C:
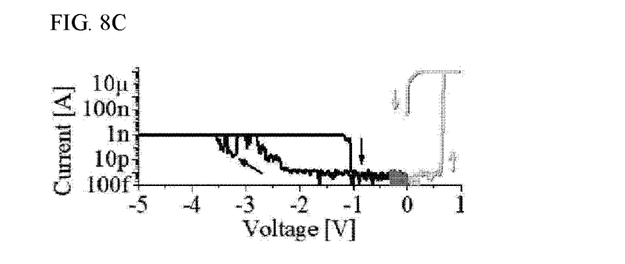
Figure 8D:
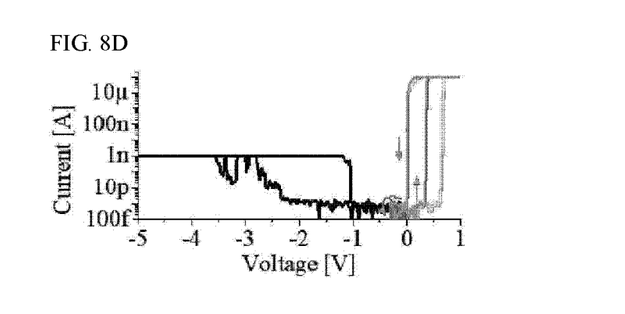

Referring to FIGS. 8A, 8B, 8C, and 8D, for example, after the negative voltage forming is performed by applying a compliance current of 1 nA to perform the first forming (S320) as shown in FIG. 8A, the positive voltage forming of applying a positive voltage to perform the second forming is performed (S330) as shown in FIG. 8B. After the second forming by application of the positive voltage, as shown in FIG. 8C, the negative voltage application switching of applying a small negative voltage of −0.3 V may be performed (S340). Further, after the negative voltage application switching, as shown in FIG. 8D, the volatile switching technique may be performed by repeatedly performing the positive voltage forming by the second forming and the negative voltage application switching.

Figure 9A:
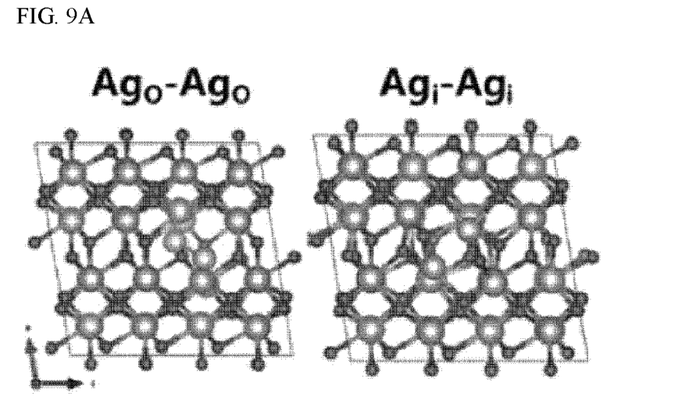
FIGS. 9A and 9B are views illustrating binding energy according to excess electrons of metal ions in oxygen vacancies through a density functional theory.
Figure 9B:
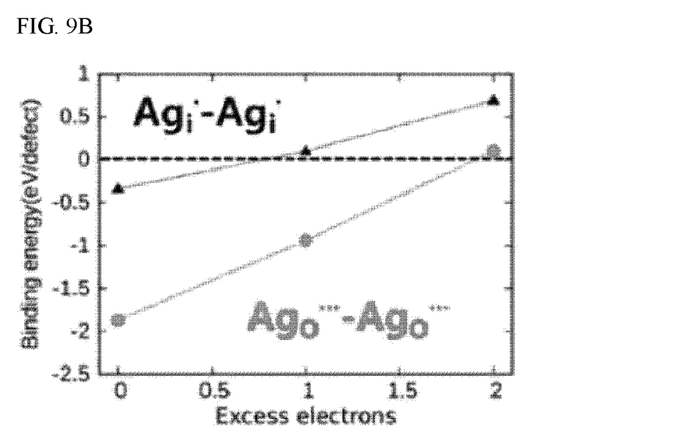

FIGS. 9A and 9B are views illustrating binding energy according to excess electrons of the metal ions in the oxygen vacancies through a density functional theory.

For example, FIGS. 9A and 9B are views illustrating binding energy according to excess electrons of Ag ions in each of two oxygen vacancies through a density functional theory. First, referring to FIG. 9B, it can be seen that the spontaneous rupture between the Ag ions located in the oxygen vacancies easily occurs. This is because, as shown in FIG. 9A, the binding energy between the Ag ions located in the oxygen vacancies has a smaller magnitude than the binding energy between Ag ions located in interstitial sites.

Figure 10:
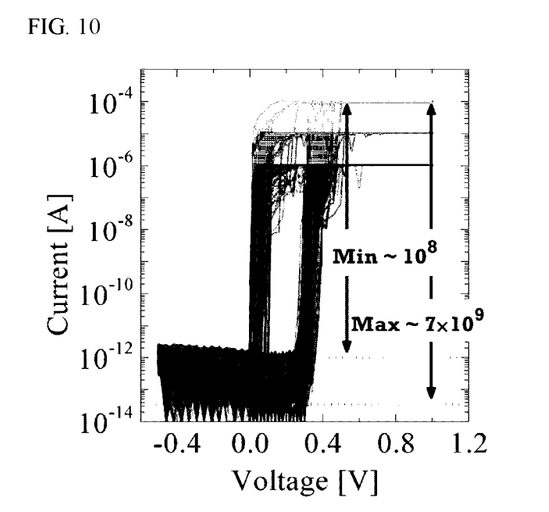
FIG. 10 is a view illustrating current-voltage curves according to the operating current of the present invention.

FIG. 10 is a view illustrating current-voltage curves according to the operating current of the present invention.

Referring to FIG. 10, FIG. 10 illustrates the current-voltage curves according to operating currents of 1 μA, 10 μA, and 100 μA for the two-terminal atom-based switching device according to the present invention. As shown in FIG. 10, since the operating currents of 1 μA, 10 μA, and 100 μA are applied, it can be seen that an on-off ratio is measured from a minimum of $10^8$ to a maximum of $7 \times 10^9$.

Figure 11A:
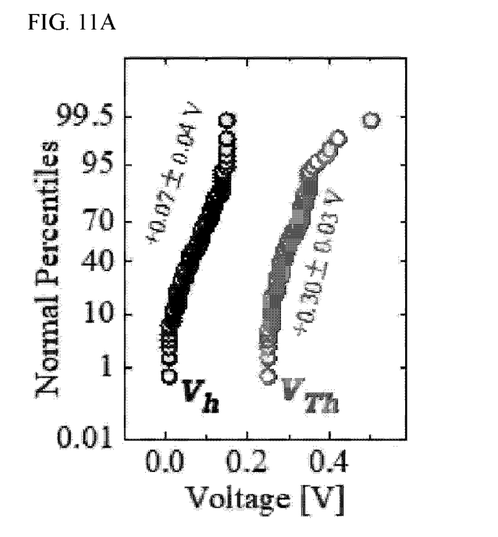
FIGS. 11A and 11B are views illustrating a threshold voltage, a hold voltage, and a threshold voltage control result for the two-terminal atom-based switching device of the present invention.
Figure 11B:
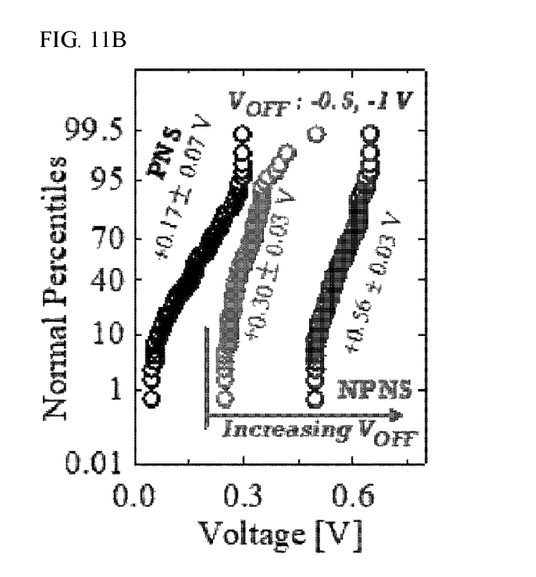

FIGS. 11A and 11B are views illustrating a threshold voltage, a hold voltage, and a threshold voltage control result for the two-terminal atom-based switching device of the present invention.

Referring to FIG. 11A, it can be seen that a threshold voltage of 0.30V±0.03 V and a hold voltage of 0.07 V±0.04 V are measured when a negative voltage of −0.5 V is applied. Further, referring to FIG. 11B, since a threshold voltage of 0.17 V±0.07 V is measured when a negative voltage is not applied (PNS), but a threshold voltage of 0.3 V±0.03 V is measured when a negative voltage of −0.5 V is applied, and a threshold voltage of 0.56 V±0.03 V is measured when a negative voltage of −1V is applied, it can be seen that the threshold voltage is controlled according to the negative voltage application switching.

Figure 12:
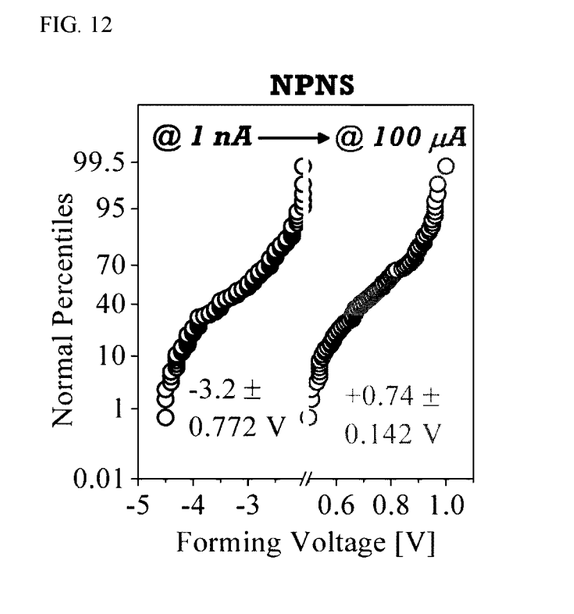
FIG. 12 is a view illustrating a voltage magnitude according to negative voltage forming and positive voltage forming of the two-terminal atom-based switching device of the present invention.

FIG. 12 is a view illustrating a voltage magnitude according to negative voltage forming and positive voltage forming of the two-terminal atom-based switching device of the present invention.

Referring to FIG. 12, the magnitude of the forming voltage for the first forming according to negative voltage application of the two-terminal atom-based switching device according to the present invention and the second forming according to positive voltage application after the negative voltage application may be confirmed.

Figure 13:
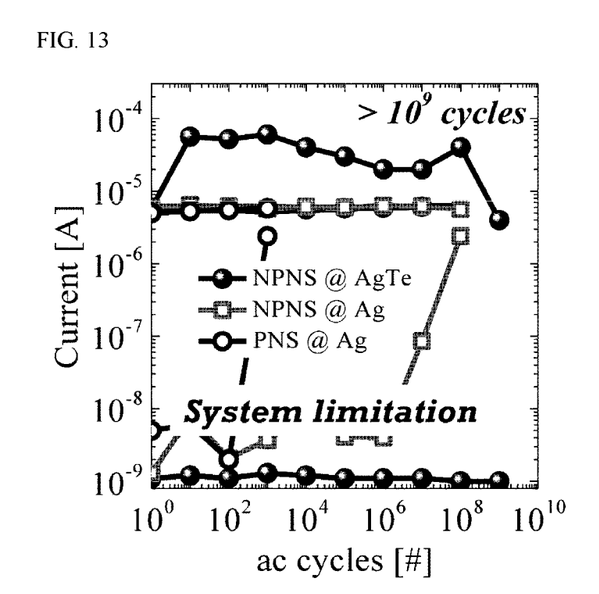
FIG. 13 is a view for comparing the durability of the two-terminal atom-based switching device of the present invention.

FIG. 13 is a view for comparing the durability of the two-terminal atom-based switching device of the present invention.

Here, comparison targets for comparing durability are classified into a case in which the upper electrode 230 is formed of Ag and the positive voltage forming and the negative voltage application switching are performed (PNS), a first embodiment (NPNS_Ag) in which the upper electrode 230 is formed of Ag and the negative voltage forming, the positive voltage forming, and the negative voltage application switching are performed, and a second embodiment (NPNS_AgTe) in which the upper electrode 230 is formed of AgTe, and the negative voltage forming, the positive voltage forming, and the negative voltage application switching are performed.

Referring to FIG. 13, it can be seen that the stuck-on failure phenomenon occurs at $10^3$ cycles in the case of PNS. However, it can be seen that the stuck-on failure phenomenon does not occur until $10^8$ cycles in the first embodiment (NPNS_Ag), and it can be seen that the stuck-on failure phenomenon does not occur until $10^9$ cycles in the second embodiment (NPNS_AgTe). That is, it can be seen that the durability of the two-terminal atom-based switching device is improved when the upper electrode 230 is formed of Ag or AgTe, and the negative voltage forming, the positive voltage forming, and the negative voltage application switching are performed.

As described above, the two-terminal atom-based switching device according to the present invention may reduce the forming voltage during the positive voltage forming by forming the oxygen vacancy percolation path through the negative voltage forming (S320) which is the first forming, and forming high binding energy and low formation energy between the oxygen vacancies and the metal ions implanted through the positive voltage forming (S330) which is the second forming after the negative voltage forming. Accordingly, it is possible to improve the volatility and durability of the two-terminal atom-based switching device by preventing excessive metal ion implantation into the insulating layer 220. Further, since most of the metal ions implanted into the insulating layer 220 are removed through the negative voltage application switching (S340) after the positive voltage forming, the volatility of the two-terminal atom-based switching device may be improved, and the stuck-on failure phenomenon in the durability may be prevented.

According to the present invention, it is possible to improve the degradation of volatility and durability which occurs while forming using a positive voltage by using negative voltage forming and negative voltage application techniques, and an atom-based switching device can have a fast operating speed and high durability according to improvement of the volatility. That is, an atom-based switching device having limitations in volatility and durability can be operated with high volatility and durability by controlling excessive metal ion implantation into an insulating layer using the negative voltage forming and negative voltage application technique.

Technical effects of the present invention are not limited to the above-mentioned effects, and other technical effects which are not mentioned will be clearly understood by those skilled in the art from the above disclosure.

Meanwhile, the embodiments of the present invention disclosed in the present specification and the drawings are merely presented as specific examples to help understanding, and are not intended to limit the scope of the present invention. It will be apparent to those skilled in the art that other modifications based on the technical spirit of the present invention may be implemented in addition to the embodiments disclosed herein.

What is claimed is:

1. A method of manufacturing a two-terminal atom-based switching device, the method comprising:
    an operation of providing a two-terminal atom-based switching device including a lower electrode, an insulating layer formed on the lower electrode, and an upper electrode formed on the insulating layer;
    a first forming operation of forming an oxygen vacancy percolation path in the insulating layer by applying a negative voltage to the upper electrode;
    a second forming operation of forming a filament by metal ions in the oxygen vacancy percolation path by applying a positive voltage to the upper electrode, and removing the applied positive voltage to make a spontaneous rupture of the formed filament; and
    a negative voltage application switching operation of removing some of the metal ions formed in the oxygen vacancy percolation path by applying a negative voltage to the upper electrode.

2. The method of claim 1, wherein the upper electrode is formed of Ag or AgTe, and the lower electrode is formed of a different material from the upper electrode.

3. The method of claim 1, wherein a compliance current, which is applied during the first forming operation, is applied as a current smaller than an operating current.

4. The method of claim 1, further comprising alternately performing the second forming operation and the negative voltage application switching operation at least twice or more after the negative voltage application switching operation.

\* \* \* \* \*